(12) United States Patent
Van Den Brand et al.

(10) Patent No.: US 9,402,306 B2
(45) Date of Patent: Jul. 26, 2016

(54) TILE, ASSEMBLY OF TILES WITH A CARRIER, METHOD OF MANUFACTURING AN ASSEMBLY

(75) Inventors: Jeroen Van Den Brand, Goirle (NL); Gerardus Titus Van Heck, Eindhoven (NL); Margaretha Maria De Kok, Eindhoven (NL)

(73) Assignee: Nederlandse Organisatie voor toegepast-natuurewetenschappelijk onderzoek TNO, Delft (NL)

( * ) Notice: Subject to any disclaimer, the term of this patent is extended or adjusted under 35 U.S.C. 154(b) by 144 days.

(21) Appl. No.: 13/574,630

(22) PCT Filed: Jan. 31, 2011

(86) PCT No.: PCT/NL2011/050063
§ 371 (c)(1),
(2), (4) Date: Aug. 20, 2012

(87) PCT Pub. No.: WO2011/093712
PCT Pub. Date: Aug. 4, 2011

(65) Prior Publication Data
US 2013/0201636 A1    Aug. 8, 2013

(30) Foreign Application Priority Data

Jan. 29, 2010 (EP) .................................. 10152129

(51) Int. Cl.
*H05K 1/00* (2006.01)
*H05K 1/02* (2006.01)
(Continued)

(52) U.S. Cl.
CPC .......... *H05K 1/0277* (2013.01); *H01L 27/3293* (2013.01); *H01L 31/0392* (2013.01); *H01L 31/042* (2013.01); *H01L 51/5203* (2013.01); *H01R 4/70* (2013.01); *H05B 33/0896* (2013.01); *H05B 33/10* (2013.01); *H05K 3/325* (2013.01); *H05K 3/365* (2013.01); *H05K 13/04* (2013.01);
(Continued)

(58) Field of Classification Search
CPC ... G09F 19/22; G09F 9/00; H01L 2251/5338; H01L 2251/5361; H01L 27/3293; H01L 31/0392; H01L 31/042
USPC ........... 174/254, 259, 260; 361/749, 751, 757
See application file for complete search history.

(56) References Cited

U.S. PATENT DOCUMENTS 3,255,047 A    6/1966  Escoffery
5,212,916 A *  5/1993  Dippel et al. ...................... 52/82
(Continued)

FOREIGN PATENT DOCUMENTS

CA    2700924 A1    4/2009
CN    2435986 Y     6/2001
(Continued)

OTHER PUBLICATIONS

International Search Report, PCT/NL2011/050063, mailing date: Jul. 1, 2011.
(Continued)

*Primary Examiner* — Yuriy Semenenko
(74) *Attorney, Agent, or Firm* — Banner & Witcoff, Ltd.

(57) ABSTRACT

An assembly of a plurality of tiles (1) with a carrier (40). The tiles (1) comprise a foil (20) with an electro-physical transducer (10) and electrical connectors (24, 28) to said transducer. The tiles are mechanically and electrically coupled to the carrier in a connection portion (1*c*) of said tiles.

10 Claims, 8 Drawing Sheets

(51) Int. Cl.
| | |
|---|---|
| *H01L 27/32* | (2006.01) |
| *H01L 51/52* | (2006.01) |
| *H01R 4/70* | (2006.01) |
| *H05K 3/36* | (2006.01) |
| *H05B 33/08* | (2006.01) |
| *H05B 33/10* | (2006.01) |
| *H05K 13/04* | (2006.01) |
| *H01L 31/0392* | (2006.01) |
| *H01L 31/042* | (2014.01) |
| *G09F 9/00* | (2006.01) |
| *G09F 19/22* | (2006.01) |
| *H01R 4/04* | (2006.01) |
| *H01R 12/70* | (2011.01) |
| *H05K 1/03* | (2006.01) |
| *H05K 1/14* | (2006.01) |
| *H05K 1/18* | (2006.01) |
| *H05K 3/32* | (2006.01) |

(52) U.S. Cl.
CPC . *G09F 9/00* (2013.01); *G09F 19/22* (2013.01); *H01L 2251/5338* (2013.01); *H01L 2251/5361* (2013.01); *H01R 4/04* (2013.01); *H01R 12/7076* (2013.01); *H05K 1/0283* (2013.01); *H05K 1/038* (2013.01); *H05K 1/147* (2013.01); *H05K 1/189* (2013.01); *H05K 3/321* (2013.01); *H05K 2201/029* (2013.01); *H05K 2201/0311* (2013.01); *H05K 2201/046* (2013.01); *H05K 2201/083* (2013.01); *H05K 2201/09081* (2013.01); *H05K 2201/09281* (2013.01); *H05K 2201/10106* (2013.01); *H05K 2201/10287* (2013.01); *H05K 2201/10484* (2013.01); *Y02E 10/50* (2013.01); *Y10T 29/4913* (2015.01)

(56) References Cited

U.S. PATENT DOCUMENTS

| 7,205,729 | B2 | 4/2007 | Thielemans | |
| 2004/0069341 | A1 | 4/2004 | Heidrich | |
| 2004/0192082 | A1* | 9/2004 | Wagner et al. | 439/67 |
| 2004/0224138 | A1* | 11/2004 | Farrell et al. | 428/209 |
| 2006/0005876 | A1 | 1/2006 | Gaudiana | |
| 2007/0115572 | A1* | 5/2007 | Van Dam et al. | 359/883 |
| 2008/0302031 | A1* | 12/2008 | Bressler et al. | 52/173.3 |
| 2009/0109368 | A1 | 4/2009 | Watanabe et al. | |
| 2009/0160311 | A1 | 6/2009 | Kubota et al. | |
| 2010/0197148 | A1* | 8/2010 | Rudisill et al. | 439/40 |

FOREIGN PATENT DOCUMENTS

| DE | 102004021570 | | 1/2005 |
| DE | 102005041333 | | 1/2007 |
| DE | 103005041333 | * | 1/2007 |
| EP | 1369923 | | 12/2003 |
| EP | 2107642 | | 10/2009 |
| JP | H0540447 | A | 2/1993 |
| JP | 2006-106764 | A | 4/2006 |
| JP | 2009152066 | A | 7/2009 |
| WO | 96/39707 | A1 | 12/1996 |
| WO | 2008/007237 | | 1/2008 |
| WO | 2008/099306 | | 8/2008 |
| WO | 2008/120138 | | 10/2008 |
| WO | 2009/133497 | A1 | 11/2009 |
| WO | 2009/134127 | A1 | 11/2009 |
| WO | 2010/067283 | A1 | 6/2010 |

OTHER PUBLICATIONS

International Search Report, PCT/NL2011/050062, mailing date: Jun. 16, 2011.

International Search Report, PCT/NL2011/050064, mailing date: Aug. 9, 2011.

Linz T et al: "Embroidering Electrical Interconnects with Conductive Yarn for the Integration of Flexible Electronic Modules into Fabric". Wearable Computers. 2005. Proceedings. Ninth IEEE International Symposium on Osaka. Japan Oct. 18-21, 2005. Piscataway. NJ. USA. IEEE. Oct. 18, 2005. pp. 86-91. XP010859534. DOI: DOI:10.1109/ISWC.2005.19, ISBN: 978-0-7695-2419-1.

* cited by examiner

TILE, ASSEMBLY OF TILES WITH A CARRIER, METHOD OF MANUFACTURING AN ASSEMBLY

CROSS-REFERENCE TO RELATED APPLICATIONS

This application is a U.S. National Stage application under 35 U.S.C. §371 of International Application PCT/NL2011/050063 (published as WO 2011/093712 A1), filed Jan. 31, 2011 which claims priority to Application EP 10152129.2, filed Jan. 29, 2010. Benefit of the filing date of each of these prior applications is hereby claimed. Each of these prior applications is hereby incorporated by reference in its entirety.

BACKGROUND OF THE INVENTION

1. Field of the Invention

The present invention relates to a tile, in particular a tile comprising an electro-physical transducer.

The present invention further relates to an assembly of tiles with a carrier.

The present invention further relates to a method of manufacturing an assembly.

2. Related Art

An electro-physical transducer is defined herein as a device that converts an electrical signal into a physical phenomenon, or that converts a physical phenomenon into an electrical signal. Examples of the first are electro-luminescent devices, electro-acoustic devices, and electro-chrome devices. Examples of the second are photovoltaic devices, acoustic sensors, and touch sensors.

Electro-optical devices are known that are manufactured in the form of a flexible foil. Although this allows certain degrees of freedom it is still not possible to deform such devices into arbitrary shapes, for example in the form of a spherical shape. It may be considered to manufacture such devices into a particular predetermined shape for example by successively depositing layers onto a mold having the desired shape. However, the resulting product can not be deformed into another shape for other applications, let alone that the product is arbitrarily deformable during use.

There is a need for electro-physical transducers that can be deformed for other purposes or that even can be arbitrarily deformed during use.

The need for having arbitrarily deformable transducers arises for example from applications in which the electronics is to be readily fitted to a certain three dimensional object, e.g. as a coverage of furniture or car interiors for example.

A need to allow for deformations during use for example arises in medical applications, for example in applications using photon radiation for treatment of the human skin. Another example is in robotics, wherein it is desired to have a touch sensitive function in an artificial skin, having a deformable shape.

It is noted that WO/2009/134127 describes a composite microphone that comprises a flexible and stretchable substrate with a grid of flexible and stretchable first and second conductors. The first conductors are arranged transverse to the second conductors. A plurality of acoustic sensors is each in connection with a respective pair of conductors in the grid. The substrate carrying the acoustic sensors can be arranged upon arbitrary shaped surfaces, for example on a hemispheric surface, therewith obtaining a microphone that is sensitive in a large spatial angle.

In an assembly of tiles with a flexible or foldable carrier it is desirable that the tiles on the one hand are reliably attached to the carrier, and that the tiles on the other hand restrict the movement of the carrier as little as possible.

SUMMARY OF THE INVENTION

According to a first aspect of the invention an assembly is provided of a plurality of tiles with a substrate, said tiles comprising a foil with an electro-physical transducer and electrical connectors to said transducer, wherein said tiles are mechanically and electrically coupled to the carrier in a connection portion of said tiles.

In the assembly according to the first aspect of the invention the tiles are attached to the carrier in a connection portion. Therewith only the connection portion restricts the freedom of movement of the carrier. A size of the connection portion is defined as the smallest rectangle SR surrounding each of the connections of the tile to the carrier. This size has an area of at most 10% of the area of a main surface of the tile.

In a preferred embodiment the connection portion is arranged centrally with respective to the tile. A centrally arranged position of the connection portion provides for a relatively reliable connection as the lateral distances from the tile to the central connection are short.

Dependent on the application the carrier may be flexible and/or stretchable in one or more directions. The carrier may be a foil, e.g. an elastic foil, e.g. a rubber foil, but may alternatively a textile. Even if the individual tiles are rigid, the arrangement as a whole is flexible and/or stretchable.

Flexible and stretchable conductors for use in an elastic medium may be realized for example by providing them in a meandering shape, as described for example in US2007115572. Alternatively materials may be used that are inherently flexible, stretchable and conductive, e.g. a blend of a conductive and a non-conductive polymer as described for example in WO9639707. Use of textile carriers is for example described in WO 2010067283 and WO 2009133497.

According to a second aspect of the invention a method of assembling a plurality of tiles with a substrate is provided, said tiles comprising a foil with an electro-physical transducer and electrical connectors to said transducer, said method comprising mechanically and electrically coupling said tiles to the carrier in a central portion of said tiles.

Accordingly the method of assembling according to the second aspect provides the assembly having the reliable attachment of tiles without too much restricting the freedom of movement of the carrier.

In an embodiment the tiles are provided at a main surface facing towards the carrier with a first and a second mutually opposite magnetic pole at mutually different lateral positions in said central portion, wherein the tiles are assembled with the carrier by a magnetic coupling between their first and second magnetic poles with respective third and fourth magnetic poles on a main surface of the carrier.

In this way the tiles are easily aligned with respect to the carrier, so that electrical contacts of the foils match with those of the carrier. For the purposes of alignment of the tile it is sufficient that the tile and the carrier each have two mutually opposite magnetic poles. Nevertheless, the tile and the carrier may be coupled by more than one cooperating pair of poles. Magnetic poles of the tile and the carrier that are mutually coupled may in addition serve as an electric connection from the carrier to the tile.

In another embodiment the tiles are assembled with the carrier by at least one conductive wire that provides for an electrical connection to at least one of the electrical conductors. A tile may be attached to the carrier for example by an electrically conductive wire analogous to the way a button is sewed to a piece of clothing. In this way a very reliable mechanical and electrical conduction is achieved.

In again another embodiment the tiles are assembled with the carrier by at least an electrically conductive adhesive. Various combinations of the above described methods may be used to advantage. For example a tile may be magnetically aligned to the substrate by the mutually cooperating poles on the carrier, and subsequently the tile may be further attached to the substrate by an electrically conductive wire connection.

In an embodiment of the assembly the plurality of tiles comprises a first plurality of tiles arranged with respect to the carrier at a first height and a second plurality of tiles arranged with respect to the carrier at a second height, larger than the first height, wherein tiles of the first plurality and the second plurality are regularly arranged between each other, so that tiles of the first plurality surround tiles of the second plurality and tiles of the second plurality surround tiles of the first plurality.

In this way tiles of the second plurality can overlap neighboring tiles of the first plurality so that a main surface of the carrier is fully covered by tiles even if the carrier is stretched.

According to a third aspect of the invention a tile is provided comprising a foil with an electro-physical transducer and electrical connectors to said transducer, the tile being provided at a central portion of a main surface with a first and a second mutually opposite magnetic pole. In an embodiment at least one of said first and second mutually opposite magnetic pole is electrically connected with an electrical connector to said transducer.

BRIEF DESCRIPTION OF THE DRAWINGS

These and other aspects are described in more detail with reference to the drawing. Therein:

FIGS. 2A and 2B show one of the tiles in a first embodiment of the assembly according to the first aspect of the invention, therein FIGS. 3A and 3B shows a tile in a second embodiment of the assembly according to the first aspect, therein

DETAILED DESCRIPTION OF EMBODIMENTS

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that, although the terms first, second, third etc. may be used herein to describe various items these items should not be limited by these terms. Items are understood too mean features described such components or elements or aspects of components or elements, e.g. a surface of an element or a height of an element. These terms are only used to distinguish one item from another item. Thus, a first item could be termed a second item without departing from the teachings of the present invention.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. All publications, patent applications, patents, and other references mentioned herein are incorporated by reference in their entirety. In case of conflict, the present specification, including definitions, will control. In addition, the materials, methods, and examples are illustrative only and not intended to be limiting.

Figure 1:
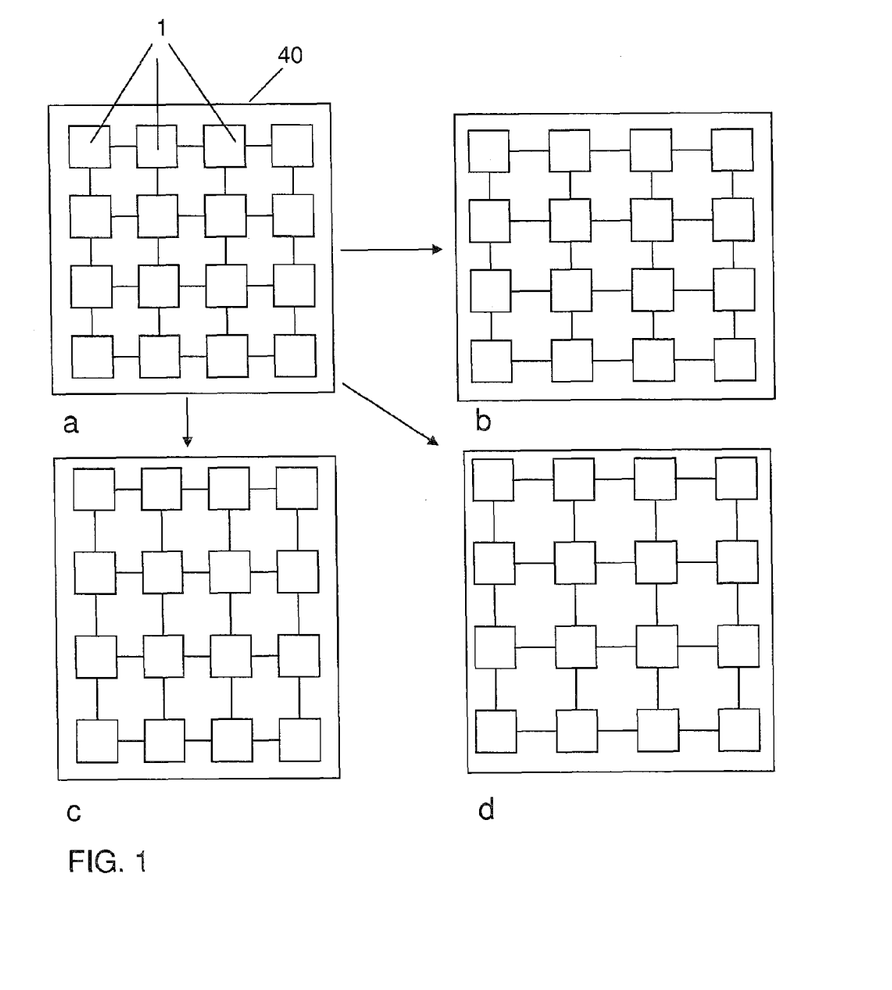
FIG. 1 shows an assembly of a plurality of tiles 1 with a carrier 40.

FIG. 1 shows an assembly of a plurality of tiles 1 with a carrier 40. In the embodiment shown the carrier is stretchable. Part a of FIG. 1 shows a relaxed state of the carrier. Part b shows a state wherein the carrier is stretched in a horizontal direction. Part c shows a state wherein the carrier is stretched in a vertical direction and Part d shows a state wherein the carrier is stretched in a both directions.

Typically the tiles are square with a side in the range of 1 to 15 cm, but also smaller sizes are possible, e.g. from 50 μm onwards. Also other shapes are possible, for example circular tiles may be used.

Figure 2A:
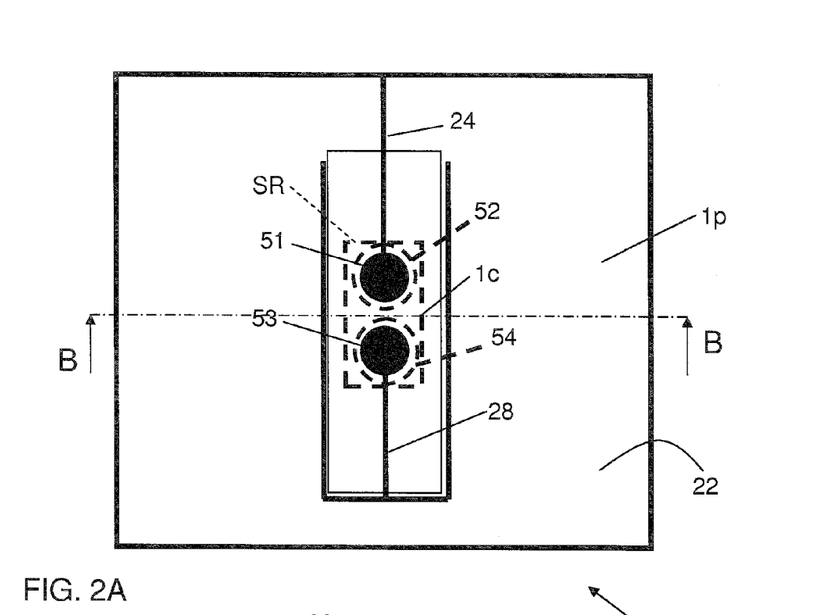
FIG. 2A shows the tile in top view and FIG. 2B shows a cross-section according to B-B in FIG. 2A.
Figure 2B:
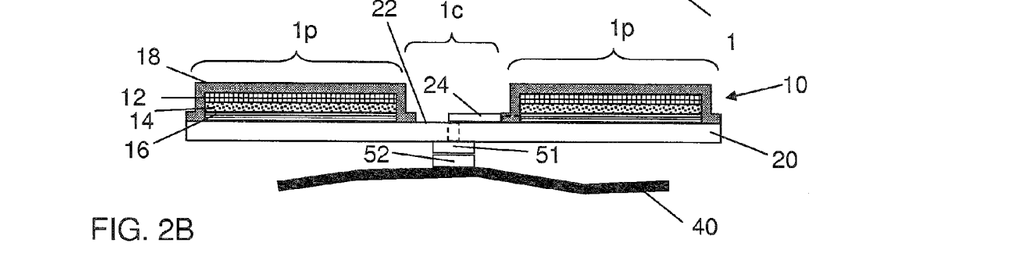

FIGS. 2A and 2B show one of the tiles 1 in more detail. FIG. 2A is a top-view, and FIG. 2B is a cross-section according to B-B in FIG. 2A. As illustrated therein the tile 1 comprises a foil 20 with an electro-physical transducer 10 and electrical connectors 24 to said transducer. The tile 1 has a connection portion 1c and a remaining portion 1p. In the embodiment shown the connection portion is arranged in a central region of the tile, and the remaining portion is a peripheral portion. The tile 1 is mechanically and electrically coupled to the carrier 40 in the connection portion thereof. In the embodiment shown the mechanical and electric coupling is provided by magnetic poles 51, 53 of the tile 1 that mutually cooperate with magnetic poles 52, 54 of the carrier 40. In the embodiment shown the smallest rectangle SR surrounding the connections formed by the mutually cooperating magnetic poles 51, 52, 53, 54 has an area of (1.4×3.0=) 4.2 units. The first main surface 22 of the foil 20 has an area of (10.4× 10.4=) 108 units. Accordingly the area of the smallest rectangle is about 3.8% of the area of the main surface of the foil 20. The relatively small area of not more than 10% occupied by the mechanical contact between the foil 20 and the carrier 40 further enhances mobility of the carrier 40.

In the embodiment shown the electro-physical transducer 10 is an electro-luminescent device. In particular the electro-luminescent device is an OLED. In the embodiment shown the OLED comprises a cathode 12, a light-emitting polymer 14 and an anode 16. The OLED further comprises an encapsulation 18. Nevertheless also other electro-luminescent devices may be contemplated, such as inorganic LEDs. The tiles 1 may alternatively or additionally be provided with other electro-physical transducers, such a photo-voltaic devices, electro acoustical devices, touch sensitive devices etc. In an embodiment the carrier comprises various tiles with mutually different types of electro-physical transducers. For example some tiles arranged on the carrier may comprise photo-voltaic devices, whereas other tiles may comprise electro-luminescent devices. In an embodiment tiles may be provided with a combination of transducers. For example a tile may comprise a combination of a touch sensitive device and an electro-luminescent device that indicates whether said touch sensitive device has detected that the tile is touched.

In the embodiment of the assembly shown in FIG. 2A, 2B a coupled pair of a magnetic poles 51, 52 of the tile 1 and the carrier 40 provides for an electrical connection to at least one of the electrical connectors 24. Likewise a further coupled pair of a magnetic poles 53, 54 of the tile 1 and the carrier 40 provides for an electrical connection to the other of the electrical connectors 28.

Figure 3A:
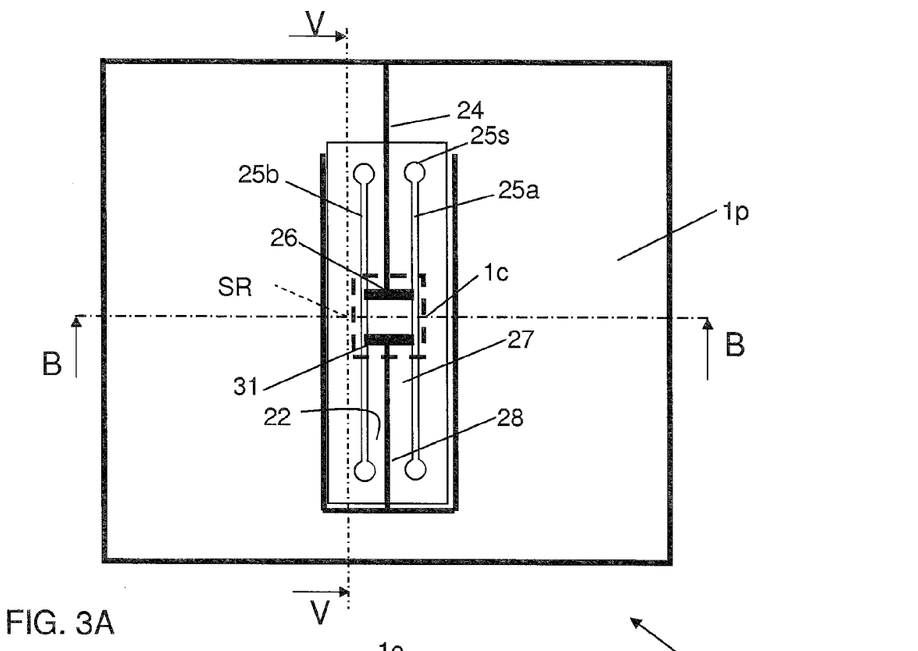
FIG. 3A is a top-view and FIG. 3B is a cross-section according to B-B in FIG. 3A, FIG. 4 and FIG. 5 show more detailed examples of applying an electrical connection according to view V in FIG. 3A.
Figure 3B:
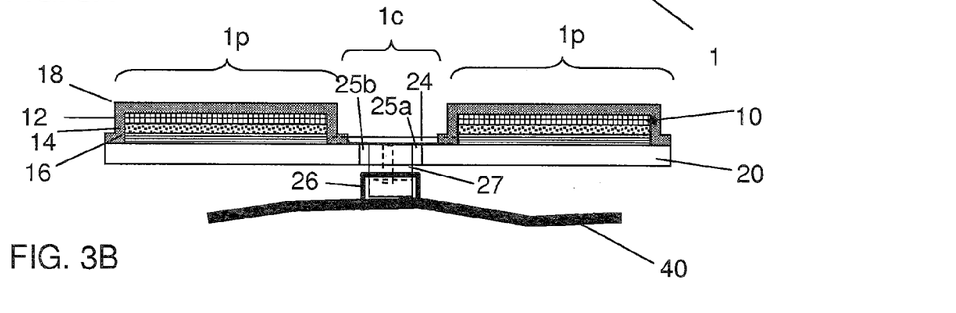

FIGS. 3A and 3B show a second embodiment. FIG. 3A is a top-view and FIG. 3B is a cross-section according to B-B in FIG. 3A. Parts therein corresponding to those of FIGS. 2A and 2B have the same reference. In the embodiment of FIG. 3A and FIG. 3B is a cross-section according to B-B in FIG. 3A. The tile 1 is assembled with the carrier 40 by at least one electrically conductive element in the form of one conductive wire 26 that provides for an electrical connection to at least one of the electrical connectors 24. In this case a further conductive wire 31 provides for an electrical connection to the other one of the electrical connectors 28.

More in particular a first and a second incision 25a, 25b through the foil 20 extend alongside the electrical connector 24 of the electro-physical transducer 10. The first and the second incision 25a, 25b are arranged mutually opposite to each other with respect to the electrical connector 24. Therewith a strip shaped portion 27 of the foil 20 is defined that has a first surface 22 that carries a portion of the electrical connector 24. The electrical connector 24 is electrically connected in said portion to an electrical conductor of the carrier 40 by an electrically conductive element 26 extending through the first incision 25a to the first surface 22, against said portion of the electrical connector 24, and away from the first surface 22 through the second incision 25b. The electrically conductive element 26 may be a separate electrically conductive element, or it may be integral with an electrical conductor in the carrier. In the embodiment shown the first and the second incision 25a, 25b further extend alongside a portion of the second electrical connector 28, at mutually opposite sides of said conductor 28. Therewith the first surface 22 of the strip shaped portion 27 of the foil 20 also carries a portion of the electrical connector 28. The electrical connector 28 is analogously electrically connected to an electrical conductor of the carrier 40 by an electrically conductive element 31 extending through the first incision 25a to the first surface 22, against a portion of the electrical connector 28, and away from the first surface 22 through the second incision 25b.

The incisions 25a,b, end into an incision prolongation stopper 25s in the form of a circularly widened end.

In this embodiment the smallest rectangle SR surrounding the connections formed by the electrically conductive elements 26, 31 has an area of (1.3×1.3=) 1.7 units. The first main surface 22 of the foil 20 has an area of (10.4×10.4=) 108 units. Accordingly the area of the smallest rectangle is about 1.5% of the area of the main surface of the foil 20.

Figure 4:
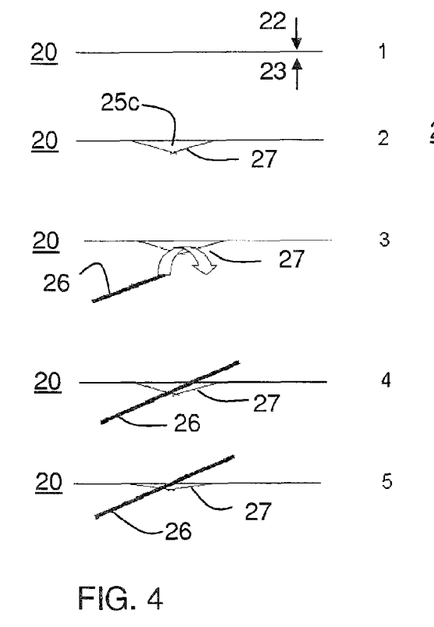
Figure 5:
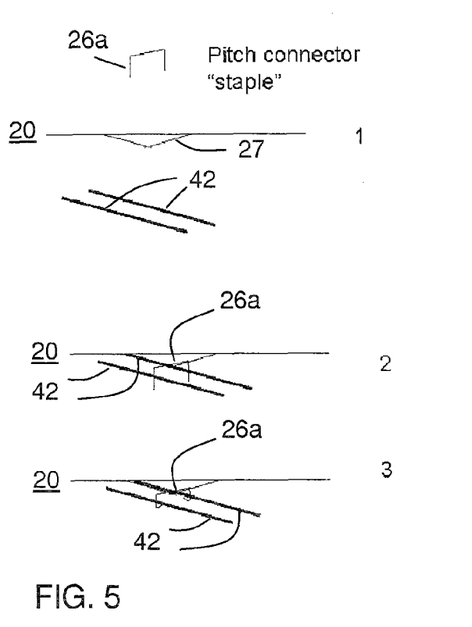

Detailed examples of applying the electrical connection to the electrically conductive element 26 are illustrated in FIG. 4 and FIG. 5 according to view V in FIG. 3A.

The first illustration (1) in FIG. 4 shows the foil 20. Reference numeral 23 indicates the main side of the foil 20 facing the carrier 40. The second illustration (2) shows the strip shaped portion 27 that is bended out of the plane of the remainder of the foil 20. Therewith an opening 25c is formed. The strip shaped portion 27 may be bended down for example by a tool that presses said portion 27 downward. Alternatively the strip shaped portion 27 may have magnetic elements that are pulled downward by a magnetic tool. The third illustration (3) shows how an electrically conductive element 26 is fed through the opening against the at least a first electrically conductive track carried by the strip shaped portion 27. The fourth illustration (4) shows the result thereof. The fifth illustration shows the foil 20 after the strip shaped portion is released and has bent back.

Figure 6:
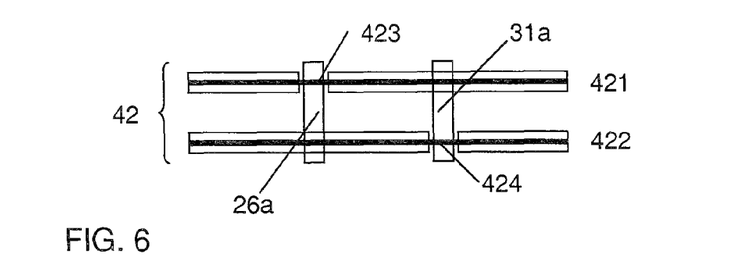
FIG. 6 shows a detail of FIG. 5.

FIG. 5 shows an alternative, wherein a staple like pitch 26a is used to connect the electrically conductive track to an electrical conductor 42 of the carrier. In this case a pair of electrical conductors 42 (See FIG. 6) comprises a first electrical conductor 421 having electric contact 423 and a second electrical conductor 422 having electric contact 424. The second illustration (2) shows the staple like pitch 26a pressed downwards. In the illustration the staple like pitch 26a embraces the electrical conductors 421, 422 of the carrier so that a mechanical connection is formed with both conductors. However, an electric connection is formed only with electrical conductor 421 at its electrical contact 423. Analogously the second staple like pitch 31a only forms an electric connection with electrical conductor 422 at its electrical contact 424.

Figure 7:
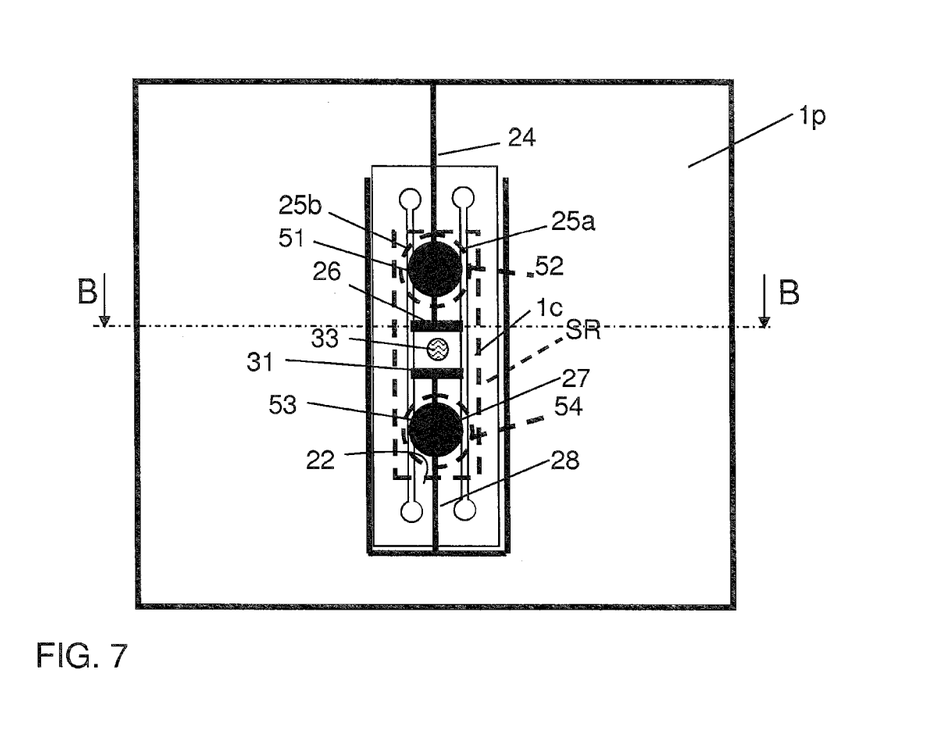
FIG. 7 shows a tile in a third embodiment of the assembly according to the first aspect.

As shown by way of example in FIG. 7, various fastenings may be combined. In the example of FIG. 7 the tile 1 is magnetically coupled to the carrier 40 as described in detail with reference to FIGS. 2A and 2B. In addition the tile 1 is further coupled to the carrier 40 as described in detail with reference to FIG. 3A, 3B, and FIG. 4-6. Additionally the tile 1 and the carrier may be attached to each other by an adhesive 33, e.g. a hot-melt adhesive, such as a polyurethane or alternatively an epoxy-based adhesive. In a still further embodiment an adhesive may be used to adhere mutually cooperating magnetic poles of the tile and the carrier to each other. The magnetic forces between the poles of the tile and the carrier may be used to align the tile with respect to the carrier and subsequently the tile may be permanently fixed in the aligned position by the adhesive and or by a wire connection according to FIGS. 3A, 3B and 4-6. If the magnetic poles are also used as an electrically conducting medium, the adhesive may be an electrically conductive adhesive, such as an epoxy based adhesive filled with Ag, arranged between the foil and the carrier.

In this embodiment the smallest rectangle SR surrounding the connections formed by the electrically conductive elements 26, 31 and the magnetic elements 51, 52, 53, 54 has an area of (1.6×4.5=) 7.2 units. The first main surface 22 of the foil 20 has an area of (10.4×10.4=) 108 units. Accordingly the area of the smallest rectangle is about 6.7% of the area of the main surface of the foil 20.

Figure 8:
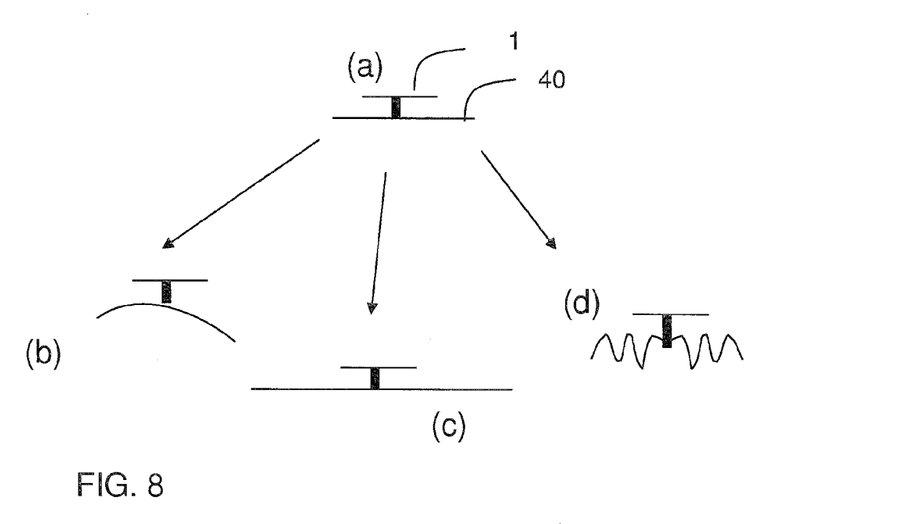
FIG. 8 shows examples of deformations of an assembly according to the first aspect.

The carrier 40 on which the tiles 1 are arranged may be textile or a foil, which may be stretchable. FIG. 8 shows that various deformations are enabled of the carrier 40. Due to the fact that only a central portion of the tiles 1 is attached to the carrier 40 (a) the carrier may be bended (b), stretched (c) and/or deformed in arbitrary ways (d).

Figure 9:
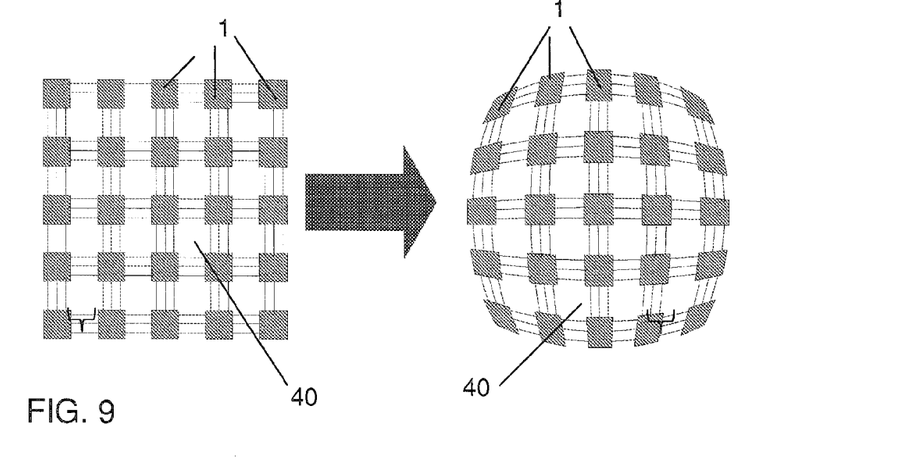
FIG. 9 shows a further example of an assembly according to the first aspect, FIGS. 10A and 10B schematically shows a further embodiment of an assembly according to the first aspect of the invention, therein

FIG. 9 shows an example wherein the carrier 40 with the tiles 1 is stretched into a spherical shape.

Figure 10A:
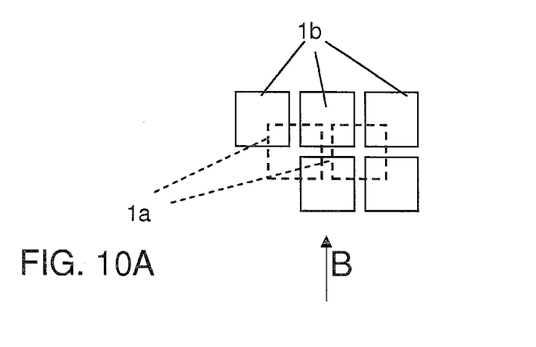
FIG. 10A shows a top view and FIG. 10B shows a side view according to B in FIG. 10A, FIGS. 11A and 11B show a stretched state of the assembly of FIG. 10A,B, therein
Figure 10B:
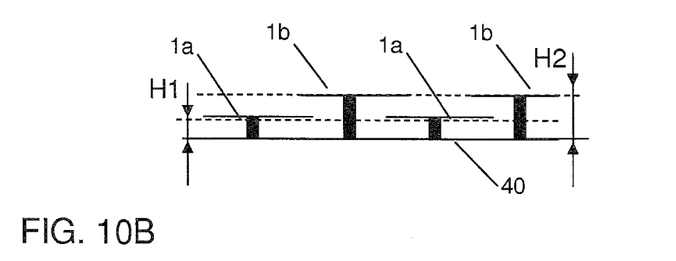
Figure 11A:
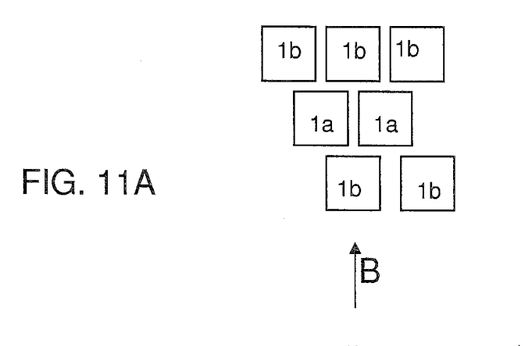
FIG. 11A shows a top view and FIG. 11B shows a side view according to B in FIG. 11A, FIG. 12A, 12B show an alternative example of an assembly according to the first aspect, therein FIG. 12A schematically a top view.
Figure 11B:
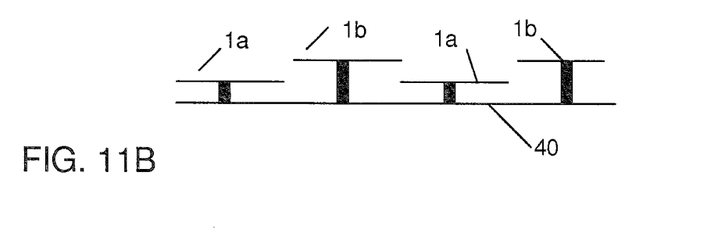

FIGS. 10A and 10B schematically shows a further assembly according to the first aspect of the invention. FIG. 10A shows a top view and FIG. 10B shows a side view according to B in FIG. 10A. In the embodiment shown in FIG. 10A the plurality of tiles 1 comprises a first plurality of tiles 1a arranged with respect to the carrier 40 at a first height H1 and a second plurality of tiles 1b arranged with respect to the carrier 40 at a second height H2, differing from the first height. Dependent on the thickness of the tiles, the first height H1 is for example in a range from 200 µm to 1 mm and the second height H2 is for example in the range of 250 µm to 1.2 mm provided that is complied with the relation H2>H1. Tiles 1a of the first plurality and the second plurality 1b are regularly arranged between each other. In particular tiles 1a of the first plurality surround tiles 1b of the second plurality and tiles 1b of the second plurality surround tiles 1a of the first plurality. FIG. 10A, 10B show the situation wherein the carrier 40 is in a relaxed unstretched state. Therein the tiles of the second plurality 1b, which are arranged relatively high overlap the tiles of the first plurality 1a. FIGS. 11A and 11B show a second situation, respectively in top view and in side view according to B in FIG. 11A. In the second situation the carrier 40 is stretched. The tiles of the second plurality 1b no longer overlap the tiles of the first plurality 1a, but the plurality tiles still fully covers the entire carrier 40. This is for example advantageous if the tiles are provided with a light emitting element for illumination purposes if a homogeneous radiation profile is desired.

Alternative embodiment are possible wherein the connection portion of the tile is decentrally arranged. An example thereof is shown in FIGS. 12A and 12B.

Figure 12A:
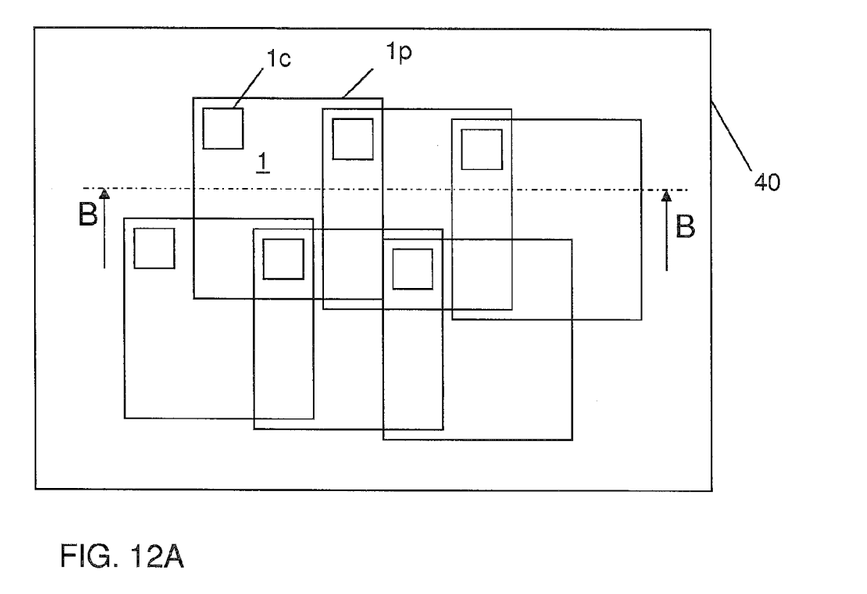
Figure 12B:
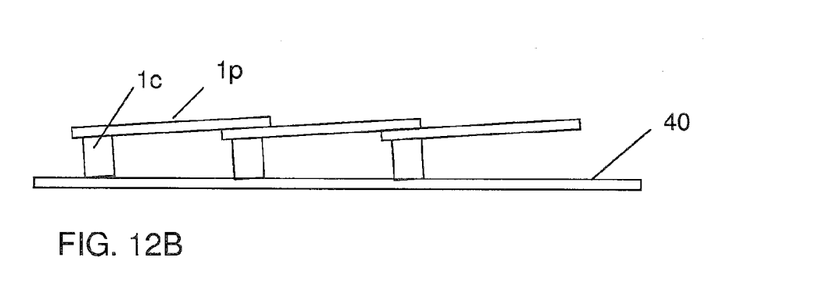
FIG. 12B shows a cross-section according to B-B in FIG. 12A.

FIG. 12A schematically shows in top view a fish scale like arrangement of tiles 1 wherein each tile 1 is partially supported by its rightmost neighbour. Likewise, each row of tiles is supported by a lower arranged row of tiles. FIG. 12B shows a cross-section according to B-B in FIG. 12A.

In the claims the word "comprising" does not exclude other elements or steps, and the indefinite article "a" or "an" does not exclude a plurality. A single component or other unit may fulfill the functions of several items recited in the claims. The mere fact that certain measures are recited in mutually different claims does not indicate that a combination of these measures cannot be used to advantage. Any reference signs in the claims should not be construed as limiting the scope.

The invention claimed is:

1. An assembly of a plurality of tiles with a carrier of an elastic medium and that is flexible and stretchable in one or more directions, and that comprises flexible and stretchable conductors, said tiles comprising a foil with an electro-physical transducer and electrical connectors to said transducer, wherein said tiles are mechanically and electrically coupled to the carrier in a connection portion of said tiles, said connection portion having a size defined by the smallest rectangle surrounding each of the connections of the tile, which is at most 10% of the area of a main surface of the tile, wherein at least one conductive wire provides a mechanical attachment, in the form of a staple like pitch, from at least one of the plurality of tiles to the carrier and an electrical connection to at least one of the electrical connectors.

2. The assembly according to claim 1, wherein the tiles are provided with a first and a second, mutually opposite main surface, said second main surface facing the carrier with a first and a second mutually opposite magnetic pole at mutually different lateral positions in said connection-portion, wherein the tiles are assembled with the carrier by a magnetic coupling between their first and second magnetic poles with respective third and fourth magnetic poles on a main surface of the carrier.

3. The assembly according to claim 1, wherein a coupled pair of magnetic poles of the tile and the carrier provides for an electrical connection to at least one of the electrical connectors.

4. The assembly according to claim 1, wherein a first and a second incision through the foil extend alongside an electrical connector of the electro-physical transducer, the first and the second incision being arranged mutually opposite to each other with respect to the electrical connector, therewith defining a strip shaped portion of the foil having a first main surface facing away from the carrier that carries a portion of the electrical connector, and wherein said electrical connector is electrically connected in said portion to an electrical conductor of the carrier by the conductive wire extending through the first incision to the first main surface, against said portion of the electrical connector, and away from the first main surface through the second incision.

5. The assembly according to claim 1, wherein the tiles are assembled with the carrier by at least an adhesive.

6. The assembly according to claim 5, wherein the adhesive is an electrically conductive adhesive.

7. The assembly according to claim 1, wherein the plurality of tiles comprises a first plurality of tiles arranged with respect to the carrier at a first height and a second plurality of tiles arranged with respect to the carrier at a second height, differing from the first height, wherein tiles of the first plurality and the second plurality are regularly arranged between each other, so that tiles of the first plurality surround tiles of the second plurality and tiles of the second plurality surround tiles of the first plurality.

8. The assembly according to claim 1, wherein said carrier is a textile.

9. The assembly according to claim 1, wherein said carrier is a foil.

10. The assembly according to claim 4 wherein said electrical connector has a further portion that forms a centrally arranged connection for the electro-physical transducer, and comprising a further electrical connector having a further portion that forms a peripherally arranged connection for the electro-physical transducer.

* * * * *